(12) United States Patent
Suzuki et al.

(10) Patent No.: US 7,625,604 B2
(45) Date of Patent: Dec. 1, 2009

(54) HEAT TREATMENT METHOD AND HEAT TREATMENT APPARATUS

(75) Inventors: Keisuke Suzuki, Tokyo-To (JP); Wenling Wang, Tokyo-To (JP); Tsukasa Yonekawa, Tokyo-To (JP); Toshiyuki Ikeuchi, Tokyo-To (JP); Toru Sato, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 800 days.

(21) Appl. No.: 10/523,803

(22) PCT Filed: Aug. 8, 2003

(86) PCT No.: PCT/JP03/10173

§ 371 (c)(1),
(2), (4) Date: Feb. 9, 2005

(87) PCT Pub. No.: WO2004/015750

PCT Pub. Date: Feb. 19, 2004

(65) Prior Publication Data

US 2005/0201894 A1  Sep. 15, 2005

(30) Foreign Application Priority Data

Aug. 9, 2002 (JP) ............................. 2002-233513
Apr. 28, 2003 (JP) ............................. 2003-124153

(51) Int. Cl.
C23C 16/00 (2006.01)
(52) U.S. Cl. ................................................. 427/255.28
(58) Field of Classification Search .............. 427/248.1, 427/9; 118/712, 715
See application file for complete search history.

(56) References Cited

U.S. PATENT DOCUMENTS 5,863,602 A * 1/1999 Watanabe et al. ........... 427/237

(Continued)

FOREIGN PATENT DOCUMENTS

JP  2000-091251  3/2000

(Continued)

OTHER PUBLICATIONS

Supplementary European Search Report, issued in connection with EP 03 78 4632, dated Jan. 31, 2007.

(Continued)

Primary Examiner—Timothy H Meeks
Assistant Examiner—Elizabeth Burkhart
(74) Attorney, Agent, or Firm—Smith, Gambrell & Russell, LLP (57) ABSTRACT

The present invention relates to a thermal processing method includes a first thermal processing step that carries out thermal processing steps using a plurality of first substrates, wherein thin films are formed on surfaces of the plurality of first substrates by means of less consumption of the process gas than on surfaces of production substrates. Then, a second thermal processing step carries out thermal processing steps by using a plurality of second substrates, wherein thin films are formed on surfaces of the plurality of second substrates by means of more consumption of the process gas than on the surfaces of the plurality of first substrates, and wherein heating units are respectively adjusted to respective temperature set values set during the previous step. Then, a third thermal processing step carries out thermal processing steps by using production substrates as the plurality of substrates, wherein the plurality of heating units are respectively adjusted to the respective temperature set values corrected during the previous step.

11 Claims, 9 Drawing Sheets

U.S. PATENT DOCUMENTS

| | | | |
|---|---|---|---|
| 6,211,094 B1 * | 4/2001 | Jun et al. | 438/758 |
| 2002/0001788 A1 * | 1/2002 | Sakamoto et al. | 432/24 |
| 2002/0014483 A1 * | 2/2002 | Suzuki et al. | 219/486 |
| 2003/0162372 A1 * | 8/2003 | Yoo | 438/484 |

FOREIGN PATENT DOCUMENTS

| | | |
|---|---|---|
| JP | 2000-340554 | 12/2000 |
| JP | 2001-077041 | 3/2001 |
| JP | 2002-025997 | 1/2002 |
| JP | 2002-043300 | 2/2002 |
| JP | 2002-141347 | 5/2002 |

OTHER PUBLICATIONS

English translation of the International Preliminary Examination Report dated Aug. 17, 2004, International Application No. PCT/JP2003/010173.

* cited by examiner

HEAT TREATMENT METHOD AND HEAT TREATMENT APPARATUS

TECHNICAL FIELD

The present invention relates to a thermal processing method and a thermal processing unit of a batch type, wherein a thermal process is conducted to a large number of substrates such as semiconductor wafers at a time.

BACKGROUND ART

In manufacturing semiconductor devices, various thermal processes such as an oxidation process or a CVD process (chemical vapor deposition) are conducted to semiconductor wafers. As a thermal processing unit of a batch type that carries out such a thermal process, a longitudinal type of thermal processing unit is known. In the unit, a large number of wafers are held by a holder, which is called a wafer boat, in a tier-like manner, and the holder is conveyed into a longitudinal type of thermal processing furnace, for example thorough a lower part of the thermal processing furnace. Then, atmosphere in the thermal processing furnace is made to be heating atmosphere of a predetermined temperature, and a thermal process is conducted. In general, area of the thermal processing furnace to be heated is vertically divided into a plurality of zones, and a heating unit and a temperature controller are provided for each zone in order to enable a temperature control for each zone.

Figure 10:
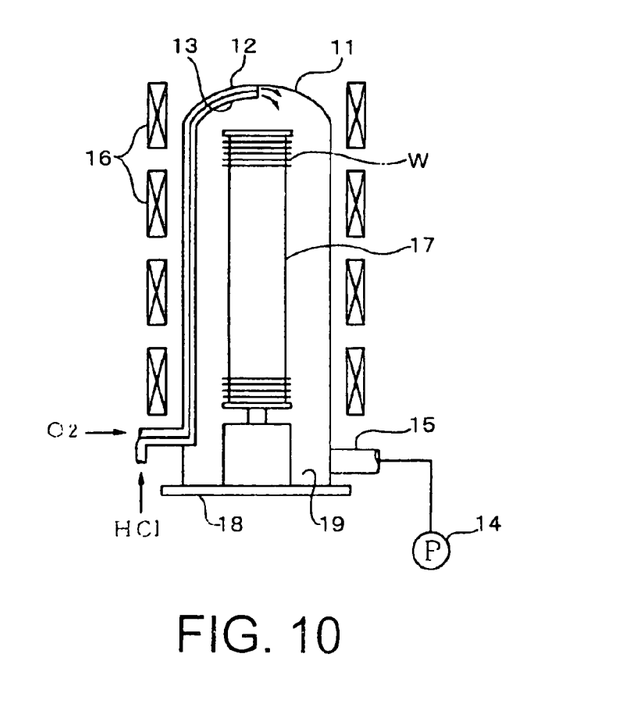
FIG. 10 is a schematic longitudinal sectional view showing a conventional longitudinal thermal processing unit.

FIG. 10 is a longitudinal sectional view of an oxidation processing unit as an example of a longitudinal thermal processing unit. In the drawing, 11 represents a reaction container whose lower end is open. Gas-supplying pipes 12 and 13 for supplying a or more gases for the oxidation process, such as an oxygen gas and a hydrogen-chloride gas, into the reaction container 11, and a gas-discharging pipe 15 that extends to a gas-discharging pump 14, are connected to a lower end portion of the reaction container 11. The gas-supplying pipes 12 and 13 are bent upward in the reaction container 11, and are opened in the vicinity of a ceiling part of the reaction container 11 to supply the respective gases therefrom. In the drawing, 16 represents a plurality of vertically-divided heaters provided around the reaction container 11. 17 represents a wafer boat for holding a large number of wafers W in a tier-like manner.

A flow of an oxidation process using the apparatus shown in FIG. 10 is briefly explained as follows. At first, for example 140 wafers W having surfaces on which silicon layers have been formed are conveyed onto the wafer boat 17. Then, the wafer boat 17 is conveyed into the reaction container 11. At that time, a lower-end opening 19 of the reaction container 11 is hermetically sealed by a lid 18 provided at a lower end of the wafer boat 17. Then, the inside of the reaction container 11 is heated to a predetermined temperature, and maintained in a state of a slightly-reduced pressure. Under the state, the process gas or gases, such as an oxygen gas and a hydrogen-chloride gas, are introduced into the reaction container 11, and thus surfaces of the wafers W are oxidized to form silicon oxide films.

When the above oxidation process is conducted, in order to make thickness of the silicon oxide films uniform between the wafers, an adjusting operation of temperature set values of the respective heaters 16 is carried out in advance (for example, claim 1 and paragraph 0003 of JP-A-2001-77041). Then, by means of a temperature controlling part not shown, a temperature control for each heater 16 is carried out in such a manner that the respective heaters 16 are maintained at the above temperature set values.

In the above adjusting operation of temperature set values, for example, dummy wafers having surfaces on which silicon oxide films have been formed are held by the wafer boat 17 in accordance with a layout depending on an arrangement layout of production wafers to be processed. Then, the thermal process (oxidation process) is conducted in accordance with predetermined temperature set values in such a manner that thickness of obtained (formed) oxide films substantially coincides with a target thickness. Then, thickness of the silicon oxide films is measured for each zone of the thermal processing atmosphere, a calculation is conducted based on a relationship between variation of the film thickness and variation of the temperature set values of the respective heaters 16, which has been obtained in advance, and then the temperature set values are corrected.

If thickness profile is not made flat by one correction, the above correction (adjusting operation) is repeatedly conducted until the thickness profile is maintained within an error range of the target thickness.

Herein, the inventor has studied a method of: creating reduced-pressure atmosphere in a reaction container, generating active species including O-radical and OH-radical by introducing a hydrogen gas and an oxygen gas into the reaction container at predetermined flow rates and by heating them to for example about 1000° C., and forming oxide films onto wafers by means of the radicals. According to the method, oxide films having good film quality can be obtained because an oxidative effect of the method is stronger than those of dry oxidation process and wet oxidation process.

On the other hand, the above document reveals that production wafers are used for the above adjusting operation. However, the temperature adjusting operation includes a plurality of thermal processes. Thus, if the production wafers are used, especially if the production wafers have larger diameters, burden of cost is great, which is not preferable. Therefore, in general, dummy wafers are used for the temperature adjusting operation.

However, in the above oxidation process using the radicals, even if the adjusting operation of the temperature set values is conducted by using dummy wafers, uniformity of thickness of oxide films formed on production wafers between surfaces (between wafers) is bad. In particular, there is tendency (loading effect) that film thickness of wafers located at a portion on a downstream side of the process gas is thinner than that of wafers located at a portion on an upstream side thereof.

Figure 11:
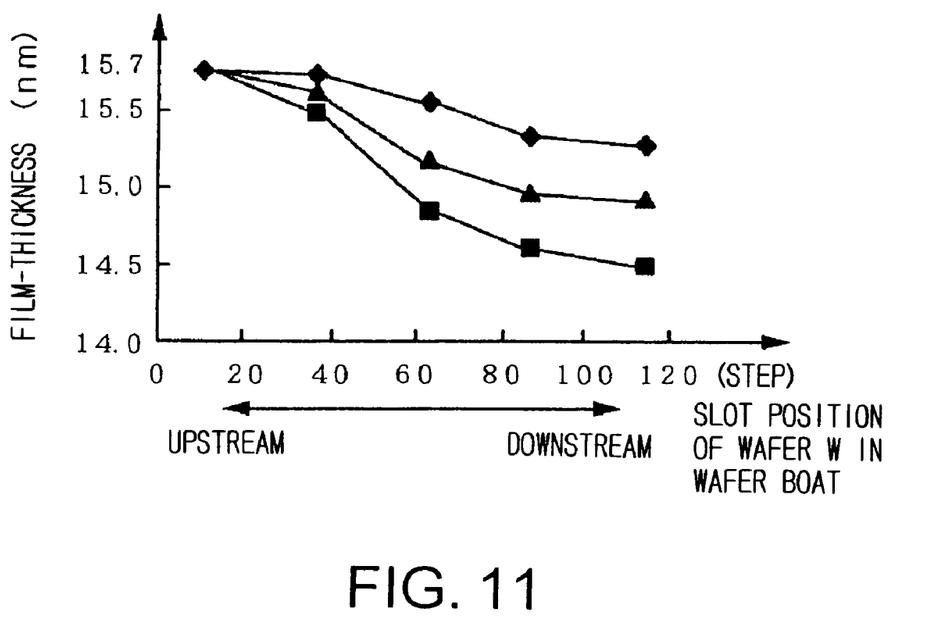
FIG. 11 is a characteristic chart for explaining problems to be solved by the present invention.

FIG. 11 shows a result of an experiment for confirming the loading effect. The temperature set values of the respective heaters 16 for the respective zones were adjusted to values according to which uniformity of film thickness between surfaces is expected to be satisfactory. Then, wafers W are fully arranged onto the wafer boat 17. An oxidation process by radicals was conducted under the same condition for the following three cases: a case wherein all the wafers W were dummy wafers; a case wherein 22 wafers (trench wafers) whose surfaces have trench structures were arranged, and a case wherein 39 trench wafers were arranged. Film thickness profile was measured for each case. ♦ is the result for the case wherein all the wafers W were dummy wafers. ▲ is the result for the case wherein 22 trench wafers were used. ■ is the result for the case wherein 39 trench wafers were used.

As seen from the results, regarding the dummy wafers on which the enough thick oxide films had been formed, uniformity of film thickness between surfaces is not so bad, although there was tendency that film thickness of wafers located at a portion on a downstream side is thin to some extent. However, when the trench wafers were used, the tendency that film thickness of wafers located at a portion on a downstream side is thin is strong. The tendency is stronger as the number of trench wafers is increased more.

The inventor thinks about the cause as follows. That is, as the wafers (trench wafers) having deep patterns (trench) have large surface areas, consumption amount of the radicals is thought to be large. On the other hand, as the dummy wafers have thick oxide films on flat surfaces thereof having no patterns, consumption amount of the radicals on surfaces of the oxide films is thought to be less than on the trench wafers.

On the other hand, if the flow rate of the process gas is increased, uniformity of film thickness within a surface of each substrate may be decreased. In addition, the pressure of the reaction chamber 11 is increased, and hence the radicals may easily lose activity, that is, lifetime of the radicals may be shortened. Thus, it is not preferable to set a large flow rate. Thus, the oxidation process using the radicals may suffer from the loading effect in the conventional manner, so that it is difficult to secure high uniformity of film quality of the oxide films between surfaces.

In addition, if process condition such as a temperature is determined depending on the arrangement layout of the production wafers, the setting operation of the process condition is troublesome. In addition, if process condition such as a temperature of each zone of the reaction container, a pressure, a gas flow rate and a processing time, is set depending on the number and/or the arrangement layout of production wafers arranged on the wafer boat, some operation miss is likely to occur.

SUMMARY OF THE INVENTION

This invention is intended to solve the above problems. The object of this invention is to provide a technique that can improve uniformity of film thickness of thin films between surfaces when the thin films are formed on the surfaces of respective substrates by conducting a thermal process to a plurality of substrates at one time. In addition, another object of this invention is to provide a technique that can obtain the same process result independent on the number of productions to be thermally processed, with less operator's burden.

This invention is a thermal processing method including thermal processing steps having:

a step of holding a plurality of substrates by means of a substrate holder, a step of conveying the substrate holder into a reaction container, a step of heating a plurality of zones of thermal process atmosphere in the reaction container by means of a plurality of heating units, respectively, and a step of forming thin films on surfaces of the plurality of substrates by introducing a process gas into the reaction container, the thermal processing method comprising:

a first thermal processing step of carrying out the thermal processing steps by using a plurality of first substrates as the plurality of substrates, wherein thin films are formed on surfaces of the plurality of first substrates by means of less consumption of the process gas than on surfaces of production substrates;

a first measuring step of measuring a thickness of the thin films formed on the surfaces of the plurality of first substrates for each of the plurality of zones of the thermal process atmosphere in the reaction container;

a first setting step of setting respective temperature set values of the plurality of heating units in such a manner that the thickness measured for each of the plurality of zones substantially coincides with a target thickness of thin films to be formed on the surfaces of production substrates, based on measurement result of the first measuring step;

a second thermal processing step of carrying out the thermal processing steps by using a plurality of second substrates as the plurality of substrates, wherein thin films are formed on surfaces of the plurality of second substrates by means of more consumption of the process gas than on the surfaces of the plurality of first substrates, and wherein the plurality of heating units are respectively adjusted to the respective temperature set values set by the first setting step;

a second measuring step of measuring a thickness of the thin films formed on the surfaces of the plurality of second substrates for each of the plurality of zones of the thermal process atmosphere in the reaction container;

a second correcting step of correcting the respective temperature set values of the plurality of heating units in such a manner that the thickness measured for each of the plurality of zones substantially coincides with the target thickness of thin films to be formed on the surfaces of production substrates, based on measurement result of the second measuring step; and a third thermal processing step of carrying out the thermal processing steps by using at least a plurality of production substrates as the plurality of substrates, wherein the plurality of heating units are respectively adjusted to the respective temperature set values corrected by the second correcting step.

Herein, the plurality of zones of thermal process atmosphere in the reaction container may not be physically divided. Boundaries between the plurality of zones may not be clear. If is sufficient for the heating units to be respectively provided for the corresponding zones.

Regarding the measurement of the thickness of the thin films, the thickness of the thin films on the first substrates or the second substrates may be measured directly. Alternatively, some of the first substrates or the second substrates may be replaced with monitor substrates to be measured, and then, after the thermal process, thickness of thin films formed on the monitor substrates may be measured as the thickness of the thin films on the first substrates or the second substrates. In the latter case, it is preferable that the monitor substrates are arranged at regular intervals.

According to the invention, since the temperature set values for the thermal process are set by using the first substrates and then corrected by using the second substrates, wherein the first substrates need less consumption of the process gas than the production substrates and the second substrates need more consumption of the process gas than the first substrates, even if there is some loading effect (phenomenon in which thickness of thin films formed on substrates located on a downstream side of the process gas is thinner, because substrates located on an upstream side thereof consume the process gas), the difference with the target thickness that may be caused by the loading effect may be canceled by the correction of the temperature set values. Thus, in the thermal process using the corrected temperature set values, high uniformity of film thickness of the thin films on production substrates may be obtained between the zones.

Preferably, the first setting step and the second correcting step may be respectively carried out based on a relationship between variation of the temperature set values and variation of the thickness of the thin films, which has been obtained in advance.

In addition, for example, in the thermal processing steps, the process gas may be activated to generate active species, and oxide films may be formed on the surfaces of the substrates by means of the active species. In the case, for example, the process gas comprises a hydrogen gas and an oxygen gas. In the case, it is preferable that the first substrates are substrates on which oxide films having an average thickness of 50 nm or more have been formed in advance. In addition, in the case, it is preferable that the second substrates are bare silicon substrates.

Alternatively, for example, in the thermal processing steps, the thin films are formed on the surfaces of the substrates by means of a chemical vapor deposition. In the case, it is preferable that the first substrates are substrates having surfaces on which patterns have not been formed, and that the second substrates are substrates having surfaces on which patterns have been formed.

In general, in the first thermal processing step, the first substrates may be fully arranged in a holding region for substrates to be processed in the substrate holder, and in the second thermal processing step, the second substrates may be fully arranged in the holding region for substrates to be processed in the substrate holder.

In the third thermal processing step, production substrates may be fully arranged in the holding region for substrates to be processed in the substrate holder. Alternatively, less number of production substrates may be arranged. In the latter case, it is preferable that the production substrates are arranged at a portion on an upstream side of a flow of the process gas introduced into the reaction container, in the holding region for substrates to be processed in the substrate holder, and the first substrates are arranged at the residual portion in the holding region. In the case, independent on the number of productions to be processed at one batch, the same thermal processing result can be obtained. In addition, as the temperature set values for the respective zones in the reaction container are common, operator's burden may be reduced and miss in setting temperatures may be prevented.

Herein, a pressure in the reaction container, a flow rate of the process gas and a time of the thermal process may be common in the second thermal processing step and in the third thermal processing step.

In addition, this invention is a thermal processing unit comprising:

a substrate holder that holds a plurality of substrates;

a reaction container into which the substrate holder is conveyed;

a plurality of heating units that respectively heats a plurality of zones of thermal process atmosphere in the reaction container;

a process-gas introducing unit that introduces a process gas into the reaction container, the process gas serving for forming thin films on surfaces of the plurality of substrates by means of a thermal process, a temperature setting part that carries out the thermal process to a plurality of first substrates, wherein thin films are formed on surfaces of the plurality of first substrates by means of less consumption of the process gas than on surfaces of production substrates, and that sets respective temperature set values of the plurality of heating units based on thickness of the thin films formed on the surfaces of the plurality of first substrates in such a manner that the thickness measured for each of the plurality of zones substantially coincides with a target thickness of thin films to be formed on the surfaces of production substrates;

a temperature correcting part that carries out the thermal process to a plurality of second substrates in accordance with the respective temperature set values set by the temperature setting part, wherein thin films are formed on surfaces of the plurality of second substrates by means of more consumption of the process gas than on the surfaces of the plurality of first substrates, and that corrects respective temperature set values of the plurality of heating units based on thickness of the thin films formed on the surfaces of the plurality of second substrates in such a manner that the thickness measured for each of the plurality of zones substantially coincides with a target thickness of thin films to be formed on the surfaces of production substrates; and a production-substrate thermal processing part that carries out the thermal process to at least a plurality of production substrates in accordance with the respective temperature set values corrected by the temperature correcting part.

For example, when the thermal process is carried out to the plurality of first substrates, the first substrates may be fully arranged in a holding region for substrates to be processed in the substrate holder, and when the thermal process is carried out to the plurality of second substrates, the second substrates may be fully arranged in the holding region for substrates to be processed in the substrate holder.

Preferably, the thermal processing unit further comprises a substrate-conveying unit that conveys a substrate onto the substrate holder, wherein the production-substrate thermal processing part is adapted to control the substrate-conveying unit in such a manner that when the thermal process is carried out to at least the plurality of the production substrates, the production substrates are arranged at a portion on an upstream side of a flow of the process gas introduced into the reaction container, in the holding region for substrates to be processed in the substrate holder, and the first substrates are arranged at the residual portion in the holding region.

In addition, preferably, the production-substrate thermal processing part has a judging part that judges the number of production substrates.

Alternatively, this invention is a controlling unit that is used for a thermal processing unit including: a substrate holder that holds a plurality of substrates; a reaction container into which the substrate holder is conveyed; a plurality of heating units that respectively heats a plurality of zones of thermal process atmosphere in the reaction container; and a process-gas introducing unit that introduces a process gas into the reaction container to form thin films on surfaces of the plurality of substrates; the controlling unit comprising:

a temperature setting part that carries out the thermal process to a plurality of first substrates, wherein thin films are formed on surfaces of the plurality of first substrates by means of less consumption of the process gas than on surfaces of production substrates, and that sets respective temperature set values of the plurality of heating units based on thickness of the thin films formed on the surfaces of the plurality of first substrates in such a manner that the thickness measured for each of the plurality of zones substantially coincides with a target thickness of thin films to be formed on the surfaces of production substrates; and a temperature correcting part that carries out the thermal process to a plurality of second substrates in accordance with the respective temperature set values set by the temperature setting part, wherein thin films are formed on surfaces of the plurality of second substrates by means of more consumption of the process gas than on the surfaces of the plurality of first substrates, and that corrects respective temperature set values of the plurality of heating units based on thickness of the thin films formed on the surfaces of the plurality of second substrates in such a manner that the thickness measured for each of the plurality of zones substantially coincides with a target thickness of thin films to be formed on the surfaces of production substrates.

Alternatively, this invention is a controlling program that is used for a thermal processing unit including: a substrate holder that holds a plurality of substrates; a reaction container into which the substrate holder is conveyed; a plurality of heating units that respectively heats a plurality of zones of thermal process atmosphere in the reaction container; and a process-gas introducing unit that introduces a process gas into the reaction container to form thin films on surfaces of the plurality of substrates; the controlling program comprising:

a temperature setting program that sets respective temperature set values of the plurality of heating units based on thickness of thin films formed on surfaces of a plurality of first substrates by a thermal process carried out to the plurality of first substrates, wherein the thin films are formed on the surfaces of the plurality of first substrates by means of less consumption of the process gas than on surfaces of production substrates, in such a manner that the thickness measured for each of the plurality of zones substantially coincides with a target thickness of thin films to be formed on the surfaces of production substrates; and a temperature correcting program that corrects respective temperature set values of the plurality of heating units based on thickness of thin films formed on surfaces of a plurality of second substrates by a thermal process carried out to the plurality of second substrates, wherein the thin films are formed on surfaces of the plurality of second substrates by means of more consumption of the process gas than on the surfaces of the plurality of first substrates, in such a manner that the thickness measured for each of the plurality of zones substantially coincides with a target thickness of thin films to be formed on the surfaces of production substrates.

DESCRIPTION OF THE PREFERRED EMBODIMENT

Figure 1:
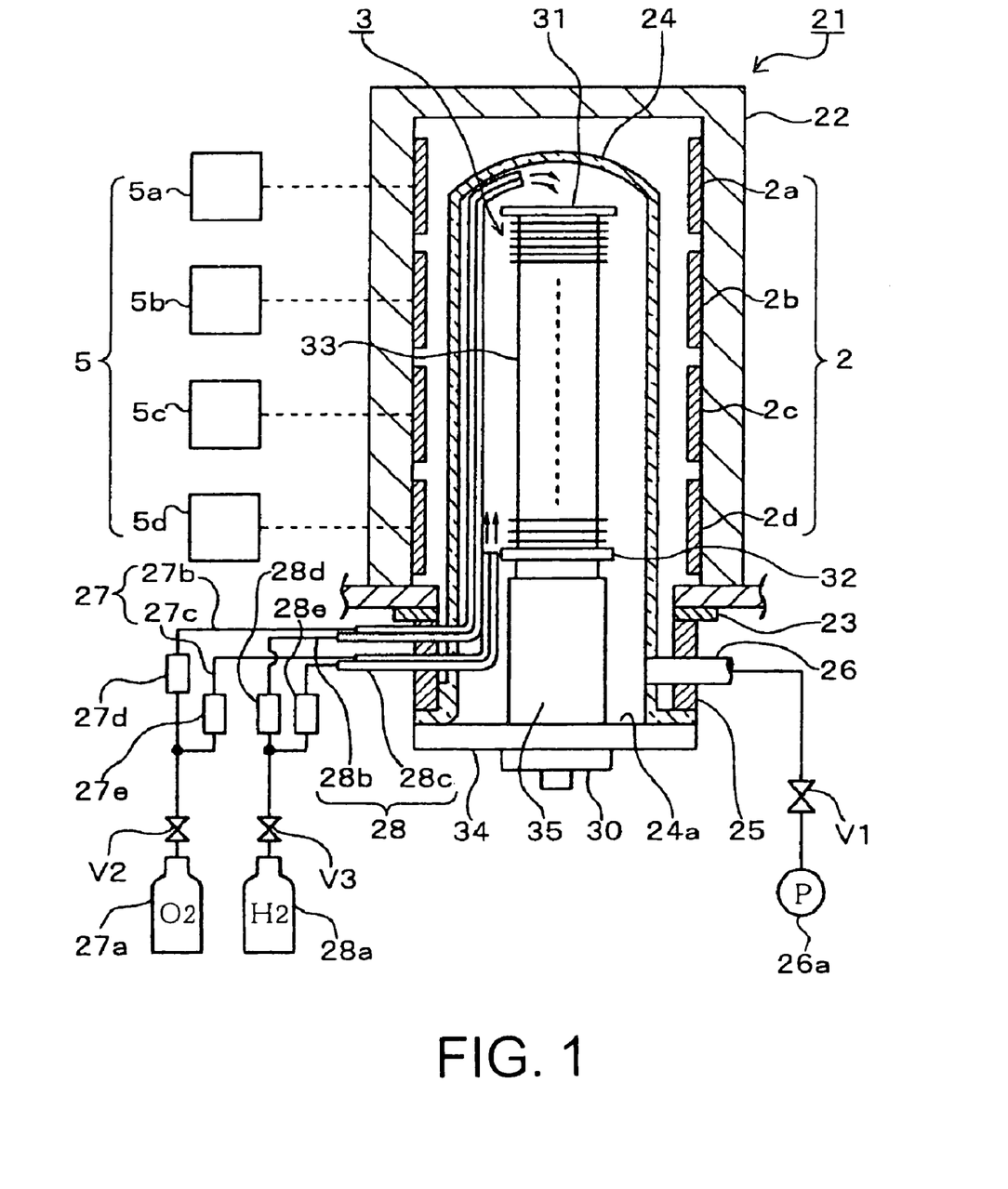
FIG. 1 is a longitudinal sectional view showing a heating furnace and a vicinity thereof in an embodiment of a thermal processing unit according to the present invention.

Hereinafter, as an embodiment of the present invention, an oxidation processing unit that is a longitudinal type of thermal processing unit is explained. FIG. 1 is a longitudinal sectional view showing the oxidation processing unit of the embodiment. A longitudinal heating furnace 21 includes a cylindrical heat-insulating body 22 whose ceiling part is closed, and a heater 2 consisting of resistance heaters provided along an inside wall of the heat-insulating body 22 in a circumferential direction, which is a heating unit. A lower end of the heating furnace 21 is fixed to a base body 23. The heater 2 is divided into for example four parts (heaters 2a, 2b, 2c and 2d) in such a manner that the heater 2 can independently heat and control each of a plurality of zones in a vertical direction. A longitudinal reaction tube 24 made of for example quartz is provided in the heating furnace 21. The reaction tube 24 forms a reaction container. Only the upper end of the reaction tube 24 is closed. Thermal-processing atmosphere is formed in the reaction tube 24. The reaction tube 24 is fixed to the base body 23 via a cylindrical heat-insulating member 25.

A gas-discharging pipe 26 extending to a gas-discharging pump 26a via a valve V1, a first gas-supplying tube 27 and a second gas-supplying tube 28 are connected to a vicinity of a lower end of the reaction tube 24. One end of the first gas-supplying tube 27 is connected to a first process-gas supplying source 27a that supplies a first process gas such as oxygen ($O_2$) gas via a valve V2. The first gas-supplying tube 27 is branched into two parts (first gas-supplying tubes 27b, 27c) on a downstream side of the valve V2. One end of the second gas-supplying tube 28 is connected to a second process-gas supplying source 28a that supplies a second process gas such as hydrogen ($H_2$) gas via a valve V3. The second gas-supplying tube 28 is branched into two parts (second gas-supplying tubes 28b, 28c) on a downstream side of the valve V3. Other ends of the first gas-supplying tubes 27b, 27c and the second gas-supplying tubes 28b, 28c are arranged through the heat-insulating member 25. The first gas-supplying tube 27b and the second gas-supplying tube 28b are bent upwardly in the reaction tube 24, tip ends thereof are located in a vicinity of the ceiling part of the reaction tube 24. The tip ends of the first gas-supplying tube 27b and the second gas-supplying tube 28b of the embodiment are bent in such a manner that the tip ends eject the process gases toward the ceiling part in a vicinity of a central portion of the reaction tube 24. Tip ends of the first gas-supplying tube 27c and the second gas-supplying tube 28c are located at a lower portion of the reaction tube 24 in such a manner that the tip ends can supply the process gases toward a lower part of a substrate holding area of a wafer boat 3 described below when the wafer boat 3 is conveyed into the reaction tube 24. In the drawing, 27d, 27e, 28d, 28e are flow-rate adjusting means, for example consisting of mass-flow controllers.

The oxidation processing unit comprises the wafer boat 3, which is a holder of wafers W that are substrates. For example, the wafer boat 3 has a plurality of pillars 33 between a ceiling plate 31 and a bottom plate 32, and peripheral edges of the wafers W are held in a tier-like manner by grooves not shown formed on the pillars 33. The wafer boat 3 is placed on a heat-insulating tube 35 on a lid 34, which can open and close an opening 24a at the lower end of the reaction tube 24. The lid 34 is provided on a boat elevator 30. When the boat elevator 30 is moved up and down, the wafer boat 3 is conveyed into and from the heating furnace 21 (reaction tube 24). In addition, for example, a rotating mechanism such as a motor may be provided in the boat elevator 30 in such a manner that the wafer boat 3 is rotated around a vertical axis by the rotating mechanism during a process.

Figure 2:
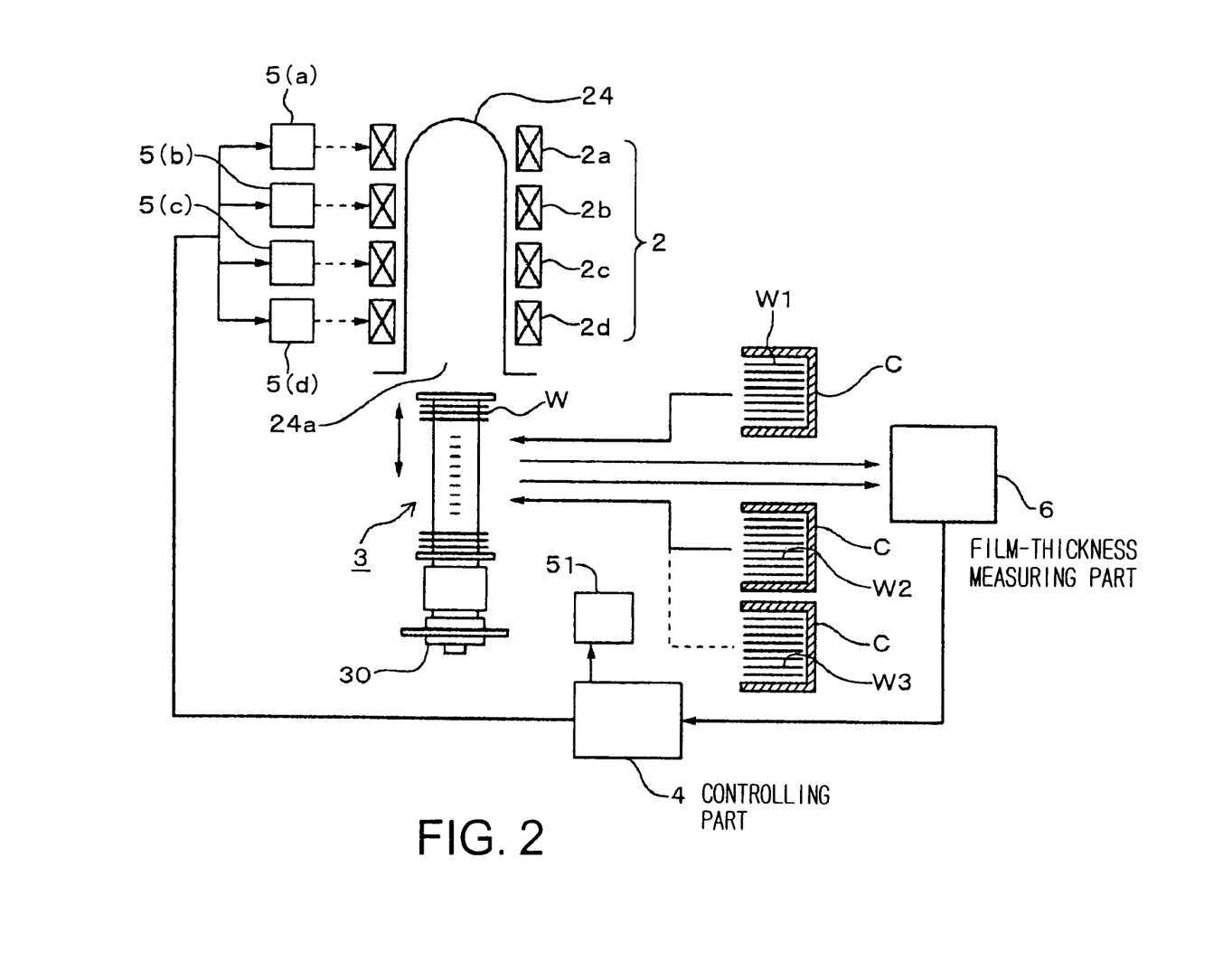
FIG. 2 is a schematic explanatory view showing a connecting condition between a controlling part and the heating furnace or other units, in the thermal processing unit.

Next, with reference to FIG. 2, a relationship between the above components and a control system is explained. In the drawing, 4 represents a controlling part, which is connected to temperature controllers 5 (5a, 5b, 5c, 5d) in order to control the respective heaters 2 (2a to 2d). Thus, the controlling part 4 is adapted to conduct a temperature control for each zone that forms the thermal-processing atmosphere. In addition, the controlling part 4 has a function to control a wafer-conveying unit not shown via a conveyance controller 51. Herein, the wafer-conveying unit includes not only a wafer arm that can deliver a or more wafers W to and from the wafer boat 3 but also a cassette-conveying unit not shown that can convey a wafer-cassette to a position accessible to a wafer arm. In the longitudinal thermal processing unit of the embodiment, production wafers W3 are prepared in a cassette C, and dummy wafers W1 and bare wafers W2 are also prepared in the cassette C, in order to conduct an adjusting operation of the temperature set values for the heater 2 (2a to 2d). These wafers W (W1, W2, W3) are conveyed onto the wafer boat 3 by means of the wafer-conveying unit.

In addition, for example, in the vicinity of the longitudinal thermal processing unit, a film-thickness measuring part 6 that measures film thickness of the wafers W is provided. The controlling part 4 is connected to the film-thickness measuring part 6. The film-thickness measuring part 6 is configured to measure film thickness of thin films formed on respective surfaces of the dummy wafers W1 and the bare wafers W2, and to send the measured values to the controlling part 4, in the adjusting operation of the temperature set values for the respective heaters 2 (2a to 2d).

Herein, correspondence to expressions defined in claims is explained. The dummy wafers W1 correspond to the first substrates that need less consumption of the process gas (radicals in the example) than the production wafers. A silicon oxide film having thickness thick enough not to suffer from the loading effect described above is formed on the flat surface having no pattern of each dummy wafer. The bare wafers W2 correspond to the second substrates that need more consumption of the process gas (radicals in the example) than the first substrates. Silicon is exposed on the flat surface having no pattern of each bare wafer.

Figure 3:
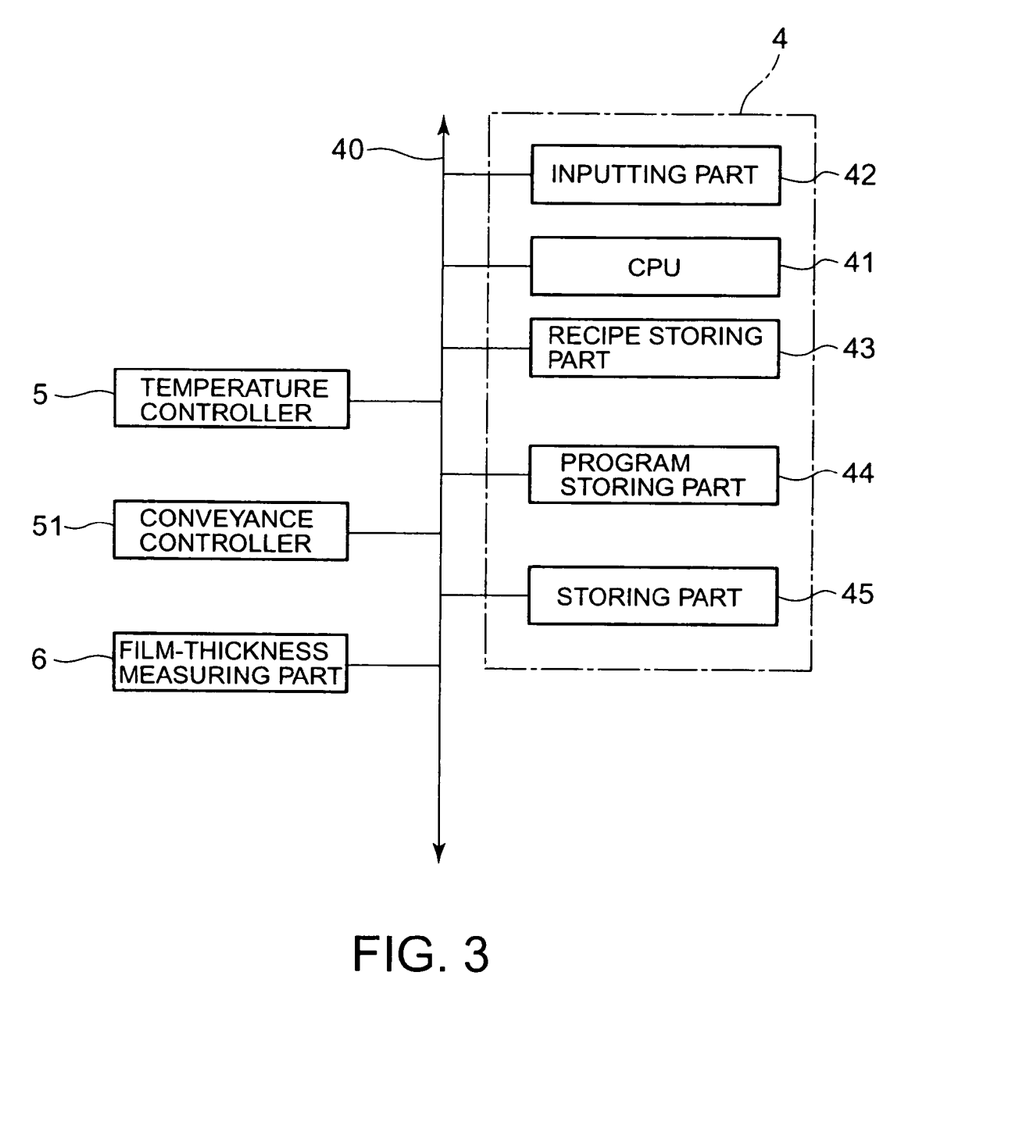
FIG. 3 is a block diagram for explaining a structure of the controlling unit.

Next, a structure of the controlling part 4 is explained. As shown in FIG. 3, the temperature controller 5 (5a to 5d), the conveyance controller 51 and the film-thickness measuring part 6 are configured to control respective objects to be controlled, in accordance with a control signal from a CPU 41 in the controlling part 4. In addition, in the controlling part 4, an inputting part 42, a recipe storing part 43, a program storing part 44 and a storing part 45 are respectively connected to a bus line 40.

The inputting part 42 is used for, for example, inputting parameters for the oxidation process and/or selecting a recipe from recipes stored in the recipe storing part 43. For example, the inputting part 42 may be formed by a touch panel or a key-operating part provided at a front panel of the unit.

In the recipe storing part 43, depending on a kind of wafers, the number of wafers placed on the wafer boat 3 and/or the arrangement layout of the wafers, many recipes in which target thickness of thin films to be formed on wafers, a flow rate of the process gas, a pressure and so on are registered (written) are prepared in advance.

In the program storing part 44, a first program, a second program and a third program are stored, the first program being prepared for setting the temperature set values for the respective heaters 2 (2a to 2d) after the oxidation process is conducted by using the dummy wafers W1, in such a manner that film thickness of the dummy wafers W1 in each zone of the thermal-processing atmosphere in the reaction tube 24 substantially coincides with a target film thickness of the production wafers W3, the second program being prepared for correcting the temperature set values after the oxidation process is conducted to the bare wafers W2 in accordance with the temperature set values that has been set according to the first program, based on film thickness of the bare wafers W2 in each zone and the target film thickness of the production wafers W3, the third program being prepared for conducting a thermal process to the production wafers W3 in accordance with the temperature set values that has been corrected.

The storing part 45 is for storing: film thickness of the oxide films on the wafers in each zone corresponding to each heater 2a to 2d, measured by the film-thickness measuring part 6; and the temperature set values; and so on.

Herein, actually, the recipe storing part 43, the program storing part 44 and the storing part 54 may be embodied in for example semiconductor memories or hard disk memories or other storage medium for a computer. However, they are represented by blocks in FIG. 3 for convenience.

Figure 4:
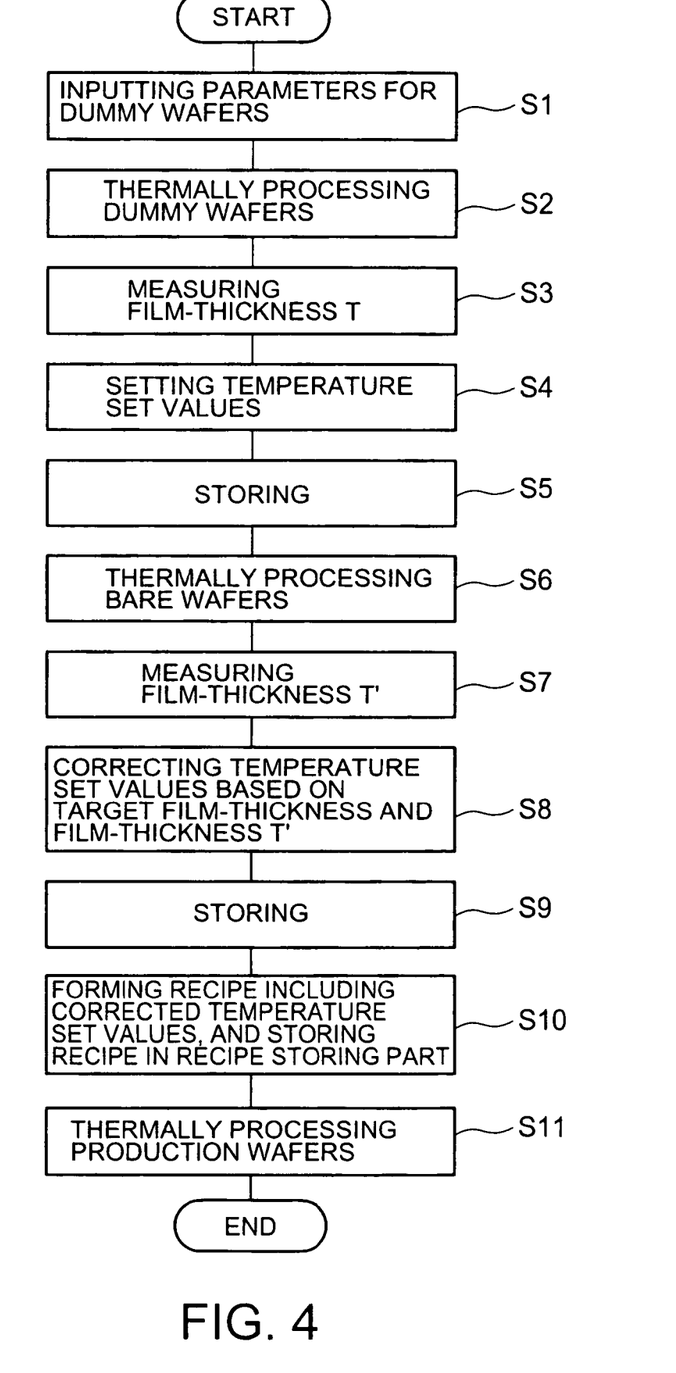
FIG. 4 is a flow chart for explaining an operation of the embodiment.

Next, an operation of the embodiment is explained with reference to a flow chart shown in FIG. 4.

At first, as shown in a step S1, parameters necessary for the oxidation process using the dummy wafers (first substrates) W1 are inputted at the inputting part 42. In the step S1, the same parameters as those in a recipe for the production wafers to undergo the oxidation process (for example, a gas flow rate, a pressure in the reaction tube 24, a processing time, and the like) are inputted. In the inputting operation in the step S1, the operator can input the parameters one by one. Alternatively, the operator can select one recipe prepared in advance in the recipe storing part 43.

After the parameters are inputted, the oxidation process to the dummy wafers W1 is started, for example by an operation at the inputting part 42 (step S2). The oxidation process is conducted according to the first program. As described below, for other processes using other wafers (the bare wafers W2 and the production wafers W3), parameters of the oxidation process other than the temperature set values, and the arrangement layout of the wafers placed on the wafer boat 3 are commonly set. Thus, these conditions are also used for the second and third programs as they are. Herein, the common arrangement layout of the wafers is not limited to that the number of the wafers and the numbers assigned for holding grooves (slots) of the wafer boat 3 are completely the same. It is sufficient that good uniformity of film thickness between surfaces can be obtained when the thermal process is conducted in accordance with a recipe.

Regarding the arrangement layout of the wafers, when the production wafers are to be processed in a full batch, that is, when the production wafers are to be fully arranged in a holding area for the production wafers, the dummy wafers W1 are fully arranged in the holding area for the production wafers.

Herein, this invention is not limited to a manner wherein the wafers are arranged in the wafer boat 3 without vacancy. For example, this invention is applicable to a manner wherein the production wafers are arranged in such a manner that a void area remains in the holding area for the production wafers.

Next, an oxidation process is conducted to the dummy wafers W1. A flow of the process is briefly explained.

At first, by means of the wafer-conveying unit not shown, the dummy wafers W are conveyed and arranged in accordance with the arrangement layout that has been set against the wafer boat 3. Thus, the dummy wafers W1 are held by the wafer boat 3 in a tier-like manner in a vertical direction. Then, the wafer boat 3 is conveyed into the reaction container.

Then, the pressure in the reaction tube 24 is reduced to a predetermined vacuum level and the thermal-processing atmosphere is heated to the respective set temperatures for the respective zones by means of the respective heaters 2 (2a to 2d). Then, the $O_2$ (oxygen) gas and the $H_2$ (hydrogen) gas are supplied into the reaction tube 24 in such a manner that the inside of the reaction tube 24 is maintained at for example 0.35 Torr (about 46.6 Pa). The temperature of the thermal-processing atmosphere is adjusted to for example about 1000° C. The flow rates of the $O_2$ gas and the $H_2$ gas are adjusted to for example $O_2$:$H_2$=9:1. The respective flow rates of the first gas-supplying tubes 27b, 27c and the second gas-supplying tubes 28b, 28c are adjusted by the respective flow-rate adjusting units 27d, 27e, 28d, 28e. Herein, the gases are supplied only from the first gas-supplying tube 27b and the second gas-supplying tube 28b that extend to the ceiling part of the reaction tube 24. In the case, the $O_2$ gas and the $H_2$ gas supplied from an upper area of the wafer boat 3 are activated under the reduced-pressure and high-temperature condition to generate active species such as O-radical and/or OH-radical, and the active species flow downward. Thus, the oxidizing reaction proceeds on surfaces of the respective wafers.

After the oxidizing reaction is completed, the dummy wafers W1 are conveyed from the longitudinal thermal processing unit to the film-thickness measuring part 6. Then, as shown in a step S3, thickness of the films on the dummy wafers W1 is measured by the film-thickness measuring part 6. Herein, for the convenience of the explanation, the dummy wafers W1 are fully arranged and the thickness of the films on the dummy wafers W1 themselves is measured. However, actually, as the oxide films have been formed on the dummy wafers W1 in advance, thickness of the newly formed oxide films thereon may not be measured. In the case, as monitor substrates, monitor wafers that are for example bare wafers may be held in a monitor-wafer holding area that has been set at predetermine intervals among the arrangement of the dummy wafers W1, thickness of the films on the bare wafers may be measured, and the film thickness may be handled as the thickness of the films on the dummy wafers W1. Even if the monitor wafers are arranged as described above, if the dummy wafers W1 are fully arranged at the residual holding area, such arrangement is substantially the same as that the dummy wafers W1 are completely arranged at the full holding area.

The film thickness is measured for each zone of the thermal-processing atmosphere, corresponding to each heater 2a to 2d. For example, if thicknesses of four films of the respective zones are measured, data of the film thickness T (T1, T2, T3, T4: film thickness of the dummy wafer W1 in each zone) are sent to the controlling part 4. Then, according to the first program, it is judged whether each film thickness T1 to T4 is within an error range of the target film thickness of the production wafers.

If each film thickness is within the error range, the temperature set values of the respective heaters 2 (2a to 2d) that has been used for the present thermal process are not changed (corrected). On the other hand, if any of the film thicknesses T1 to T4 is not within a predetermined range from the target film thickness, the temperature set values are corrected in such a manner that the film thicknesses T1 to T4 substantially coincide with the target film thickness (step 54).

In the correcting operation of the temperature set values, based on a relationship between variation of the film thickness and variation of the temperature set values that has been obtained in advance, it is calculated how much the temperature set values should be changed from the current values in order for measured film thicknesses to substantially coincide with the target film thickness. Thus, the temperature set values suitable for achieving the target film thickness under the present process condition may be calculated. Herein, as the "relationship between variation of the film thickness and variation of the temperature set values" used in the first program, used is a table or the like that associates temperature with the variation of the film thickness, for example, defines how many nm the film thickness is increased or decreased by raising a temperature set value by 1° C. at a value of the measured film thickness. Specifically, when a measured value of film thickness according to a temperature set value y1 is x1, the target film thickness is x0, and the relationship between variation of the film thickness and variation of the temperature is $\Delta y/\Delta x$, the temperature set value is corrected to y1+(x0−x1)×$\Delta y/\Delta x$.

Figure 5:
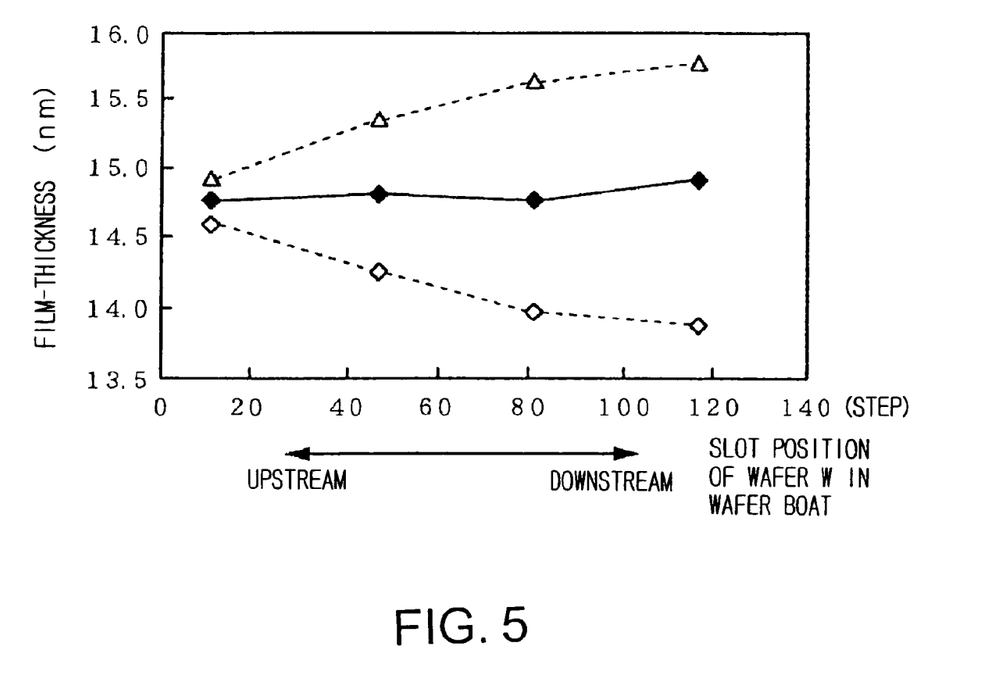
FIG. 5 is a characteristic chart showing a temperature adjusting operation of the embodiment, based on a relationship between wafer holding positions and film thicknesses.

As described above, new suitable temperature set values are calculated by using the oxidation process using the dummy wafers W1. Then, as shown in a step S5, the new suitable temperature set values are stored in the storing part 45. Thus, the setting operation of the temperature set values is completed. Herein, FIG. 5 is a characteristic chart showing film-thickness profiles of wafers that have undergone the oxidation process. The ordinate axis represents the film thickness, and the transverse axis represents a position of wafer slot in the wafer boat 3. The first (leftmost) step on the transverse axis means the uppermost step, and the 140-th (rightmost) step means the lowermost step. In FIG. 5, the film-thickness profile shown by ♦ is a film-thickness profile obtained by the oxidation process using dummy wafers W1 wherein the temperature set values that has been set at the step S5 were used and the target film thickness was 14.7 nm. In the case, it is understood that the temperature set values for the respective heaters 2 (2a to 2d) are set in such a manner that the film thickness of the oxide films of each zone substantially coincides with the target film thickness.

After the temperature setting operation using the dummy wafers W1 is conducted as described above, bare wafers W2 as the second substrates are arranged in the holding area for the production wafers W3 of the wafer boat 3. Then, the oxidation process shown by a step S6 is conducted. Herein, the new temperature set values for the respective heater 2 (2a to 2d) stored in the previous step are used. Conditions other than the temperature set values are the same as those for the oxidation process in the step S2.

After the oxidation process is completed, the bare wafers W2 are conveyed out from the longitudinal thermal processing unit to the film-thickness measuring part 6. Then, as shown in a step S7, thickness of the films on the bare wafers W2 is measured. Thus, film thickness T' (T1', T2', T3', T4': film thickness of the bare wafer W2 in each zone) may be obtained. The bare wafers 2 consume more radicals because silicon is exposed on surfaces of the bare wafers. Thus, enough amounts of the radicals are not supplied to a portion on a downstream side of the process gas. Thus, even if an oxidation process is conducted according to the temperature set values obtained by using the dummy wafers W1, film-thickness profile is not flat and not maintained within the vicinity of the target film thickness. For example, when the target film thickness is 14.7 nm, as shown in FIG. 5 by ◊, the film-thickness profile is lower on the right side. Maximally, the film thickness is thinner by about 0.7 to 1.0 nm.

After the film thickness T' is obtained, according to the second program, a correcting operation of the temperature set values is conducted as shown in a step S8. That is, the temperature set values are corrected, in such a manner that the film-thickness profile becomes substantially flat and substantially the same as the target film thickness when wafers being likely to suffer from the loading effect, such as the bare wafers W2, are used.

The correcting operation is specifically explained with reference to FIG. 5.

When the step S7 is completed, the target film thicknesses of the respective zones corresponding to the respective heaters 2 (2a to 2d) are for example commonly about 14.7 nm. However, actually, as shown in FIG. 5, the film thicknesses T1' to T4' are lower than the target film thickness. In addition, differences between the film thicknesses T1' to T4' and the target film thickness are not the same. As described above, the film-thickness profile shown by ◆ in FIG. 5 is about oxide films formed on the dummy wafers W1 that consume fewer radicals. On the other hand, the film-thickness profile shown by ◇ is about oxide films formed on the bare wafers W2 that consume more radicals. In the former case, there is no or hardly any loading effect. In the latter case, there is great loading effect. That is, the difference between ◆ and ◇ is film-thickness difference based on the both loading effects.

Then, the second program determines (corrects) the temperature set values of the respective heater 2 (2a to 2d) in order to thicken the target film thicknesses of the respective zones by the differences between the present target film thickness and the film thicknesses T' to cancel the film-thickness differences based on the loading effects, that is, in order to obtain film-thickness profile shown by ◇ in FIG. 5 about the oxide films on the dummy wafers W1. When the temperature set values are determined, the respective temperature set values for the respective zones (heaters) are calculated by using the relationship between variation of the film thickness and variation of the temperature set values, which has been obtained in advance as described above.

Then, as shown in a step S9, the corrected temperature set values are stored in the storing part 45.

Then, as shown in a step S10, as temperature set values under the condition of the oxidation process that has been set in the step S1, the temperature set values corrected in the step 58 are written into a recipe, and the recipe is stored in the recipe storing part 43.

After that, by using the recipe, the same oxidation process is conducted to the production wafers (step S11).

As described above, according to the present embodiment, when an oxidation process (a thermal process) is conducted to wafers in a batch manner to form oxide films on surfaces of the wafers, an adjusting operation for temperature set values is conducted by using dummy wafers W1, which generate no or hardly any loading effect (phenomenon in which thickness of oxide films formed on wafers located on a downstream side is thinner, because oxide films on wafers consume radicals), and a thickness amount reduced from the target film thickness due to the loading effect is obtained by using bare wafers W2, which generate loading effect, and the temperature set values are raised to compensate the thickness amount, i.e., film-thickness difference due to the loading effect. Thus, if an oxidation process is conducted to production wafers W3 by using the temperature set values set and corrected as described above, the loading effect is canceled and high uniformity of film thickness of the oxide films on the wafers is obtained between the zones.

In addition, the adjusting operation for the temperature set values is conducted by using the oxidation process using the dummy wafers W1, which generate no or hardly any loading effect, and a difference between the film thickness and the target film thickness caused by the loading effect is measured by using the oxidation process using the bare wafers W2, which generate loading effect, and the temperature set values are adjusted again based on the difference. Thus, the adjusting operation for the temperature set values is conducted more easily than a trial-and-error adjusting operation for the temperature set values for example by using the production wafers W3.

Herein, the bare wafers used in the present embodiment are used as substitutes of the production wafers. Thus, if the wafers consume the process gas in the same manner as the production wafers, the wafers may have any pattern or not, and the shape of pattern is also not limited. For example, if the production wafers have patterns on surfaces thereof in advance, instead of the bare wafers, the production wafers or other wafers having the same patterns may be used.

Recently, there is tendency wherein various kinds of wafers are produced by small lots. Thus, the production wafers may be thermally processed in a state wherein the number of production wafers is smaller than the maximal number of production wafers that can be arranged in the wafer boat 3. A preferable embodiment suitable for such a case is explained. In the embodiment, in the same manner as the previous embodiment, the steps S1 to S10 as shown in FIG. 4 are conducted. That is, the thermal process to the dummy wafers W1 in the step S2 of FIG. 4 is conducted in a state wherein the dummy wafers W1 as the first substrates are fully arranged in the holding area for the production wafers of the wafer boat 3, and the thermal process to the bare wafers W2 in the step S6 of FIG. 4 is conducted in a state wherein the bare wafers W2 as the second substrates are fully arranged in the holding area.

Figure 6:
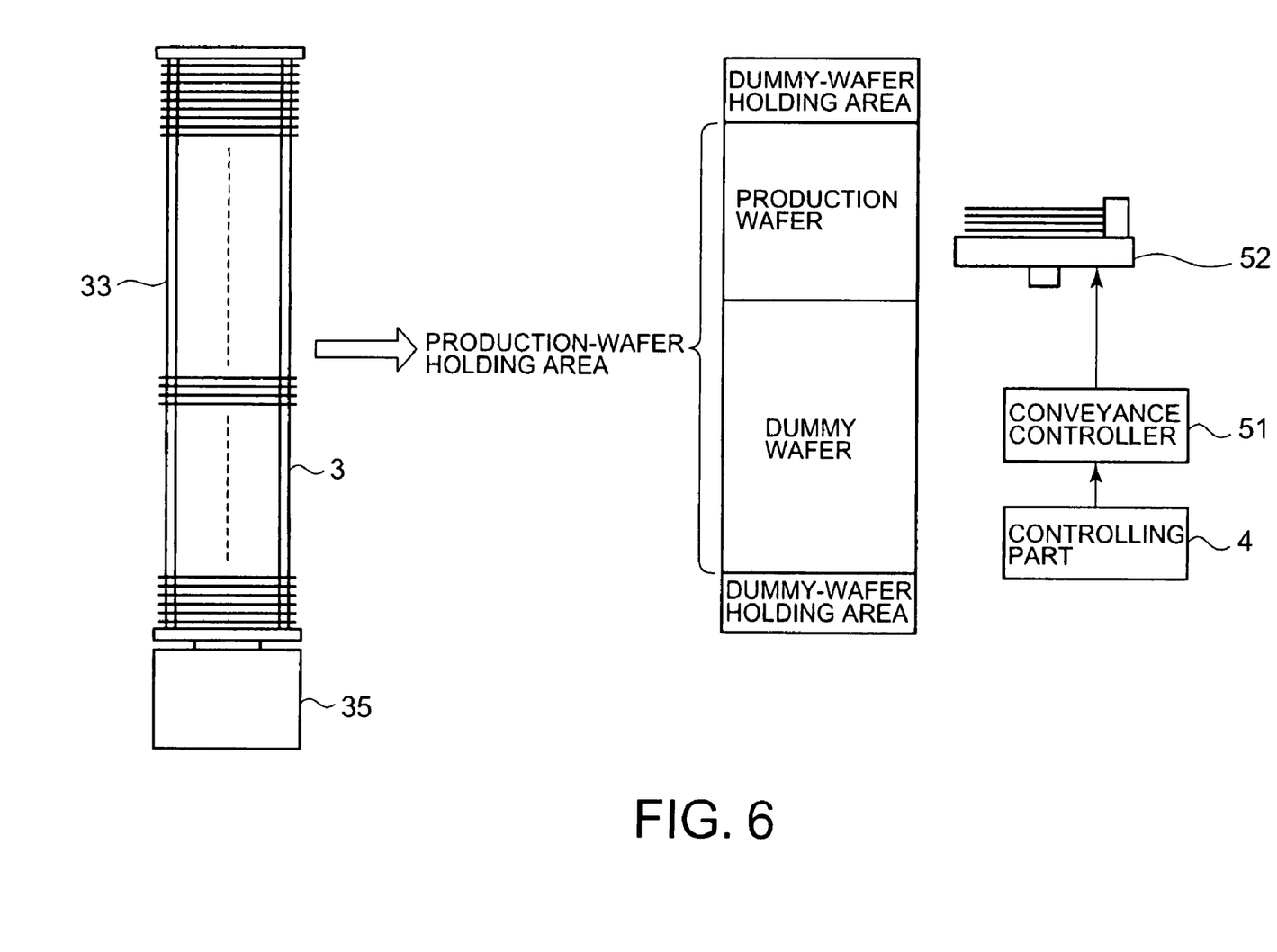
FIG. 6 is an explanatory view showing another embodiment of the present invention.

FIG. 6 is a view showing the present embodiment. The temperature set values corrected in the step S8 of FIG. 4 is stored in a storing part not shown of the controlling part 4. Then, when the thermal process to the production wafers W3 is conducted, the controlling part 4 judges the number of the production wafers W3 in one batch. The judgment is conducted by a CPU, for example based on information about the number sent from a station computer that has carried out the previous step via online, or information about the number sent from a mapping sensor provided in the thermal processing unit.

Then, the controlling part 4 controls the wafer-conveying unit 52 via the conveyance controller 51 in such a manner that the wafer-conveying unit 52 takes out the production wafers W3 from a wafer cassette C as shown in FIG. 2 and delivers them to the wafer boat 3. At that time, as shown in FIG. 6, in the holding area for the production wafers W3 of the wafer boat 3, the production wafers W3 are arranged closely on an upstream side (upper side in this example) of the process gas supplied into the reaction container. Then, the dummy wafers W1 are arranged closely in the residual holding area for the production wafers W3, to form a full-batch state. Then, the wafer boat 3 is conveyed into the reaction container, the thermal process is conducted, and the oxide films are formed on the production wafers W3. In the thermal process, independently on the number of the production wafers W3, the temperature set values stored in the storing part are used. In addition, process parameters other than temperature, such as a pressure in the reaction container, a flow rate of the process gas, a time of the thermal process and so on, are the same as used in the thermal process to the bare wafers W2 in the step S6.

According to the present embodiment, as seen from an example described below, the same film-forming result i.e.

the same film thickness of the oxide films can be obtained on the production wafers, independently on the number of the production wafers W3, nevertheless the common process condition is used. Thus, compared with a case wherein each process condition is set for each number of the production wafers W, the setting operation of the process condition is easy. In addition, it is unnecessary to select the process condition every when the number of the production wafers W3 is changed, so that the operator's burden is light. In addition, miss in setting the process condition may be prevented.

This invention is also applicable to other kinds of thermal processes that may generate loading effect. For example, instead of the oxidation process, it is also applicable to a film-forming unit by means of a chemical vapor deposition (CVD), in which dichlorosilane ($SiH_2Cl_2$) and ammonia ($NH_3$) are used as a process gas and decomposed by giving thermal energy, and thin films of silicon nitride (SiN) are formed on wafers by means of a vapor phase reaction. In the case, an amount of the process gas consumed in the CVD may change only depending on size of grooves (size of surface area) of patterns formed on surfaces of the wafers. Thus, as the first wafers, wafers that consume a small amount of the process gas, such as dummy wafers or bare wafers having no pattern as described above, are used. As the second wafers, wafers having trenches that consume a large amount of the process gas, such as wafers having the same pattern as the production wafers, are used. Then, by using the first and second substrates, the correcting operation of the temperature set values is conducted in the same manner as the above oxidation process, so that uniformity of film thickness of the thin films formed on the production wafers may be improved between surfaces.

In the above explanation, the supply (flow) direction of the process gas in the heating furnace 21 is not limited to the downward direction from an upper portion of the wafer boat 3. For example, the process gas may be also supplied accessorily from the first gas-supplying tube 27c and the second gas-supplying tube 28c provided at the lower portion. In addition, one end of the gas-discharging pipe 26 may be connected to the ceiling part of the reaction tube 2 and the process gas may be supplied only from the lower portion of the reaction tube 24, in such a manner that the flow direction of the process gas is opposite to the above embodiments (the process gas flows in an upward direction from a lower portion).

EXAMPLE

A wafer boat, which can hold 100 wafers in a holding area for production wafers, was used, dummy wafers were fully arranged in the holding area for production wafers, and an oxidation process as a thermal process was conducted. In an area other than the holding area for production wafers of the wafer boat, such as in an uppermost area and a lowermost area of the wafer boat, dummy wafers called side dummy wafers or the like were arranged. Regarding the thermal process condition, a temperature of the thermal-processing atmosphere was 1000° C., and flow rates of an $O_2$ gas and an $H_2$ gas were $O_2:H_2=2:1$. Herein, the temperature of the thermal-processing atmosphere means for example a set temperature at a central portion in a vertical direction of the holding area for the production wafers. Then, an adjusting operation of the temperature set values for the respective zones of the reaction container was conducted in such a manner that respective film thicknesses of monitor wafers located at the 10-th step, the 50-th step, the 80-th step and the 110-th step of the holding grooves of the wafer boat substantially coincide with a target film thickness.

The film thickness of the oxide films formed in the thermal process conducted for the adjusting operation of the temperature set values was examined. Then, the result shown by ♦ in FIG. 7 was obtained.

Then, bare wafers were fully arranged in the holding area for the production wafers, the thermal process was conducted under the same process condition, and film thickness of oxide films was examined in the same manner. Thus, the result shown by ◇ in FIG. 7 was obtained.

Figure 7:
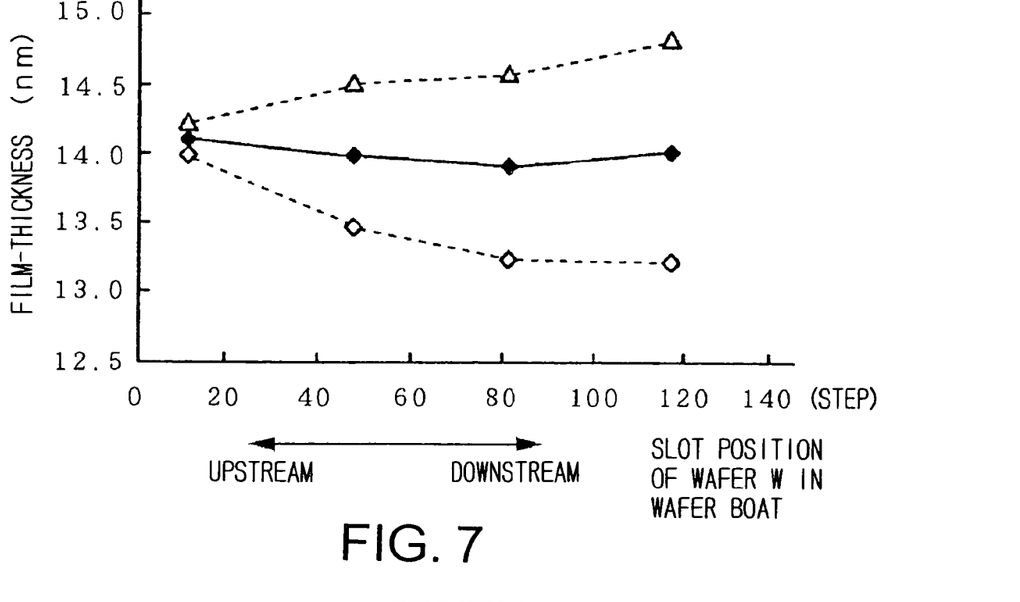
FIG. 7 is a characteristic chart showing a temperature adjusting operation of the embodiment, based on a relationship between wafer holding positions and film thicknesses.

The temperature set values of the respective zones were corrected as described above in such a manner that the film thickness of the oxide films formed by the thermal process in each zone is thickened by a difference between the target film thickness of the production substrates and the film thickness shown by ◇. That is, the temperature set values for the respective zones were corrected in such a manner that the film thickness profile shown by Δ in FIG. 7 is obtained about the oxide films formed on the dummy wafers.

As described above, the temperatures of the respective zones were set, and evaluation of the bare wafers as substitutes of the production wafers was conducted. That is, the bare wafers (bare silicon wafers) were held in the holding area for the production wafers of the wafer boat, the number of the bare wafers was variously changed, the thermal process was conducted under the same process condition, and film thickness of the oxide films on the bare wafers was measured. Specifically, the number of held bare silicon wafers was 25, 50, 75 and 100. In any of the four cases, the bare silicon wafers were closely arranged on the upstream side (upper side in this example) of the holding area for the production wafers. In this example, the bare silicon wafers were arranged serially downward from the 10-th uppermost step of the holding grooves of the wafer boat. Dummy wafers were arranged in the residual holding area. In any thermal process, process conditions other than the number of bare wafers were the same.

Figure 8:
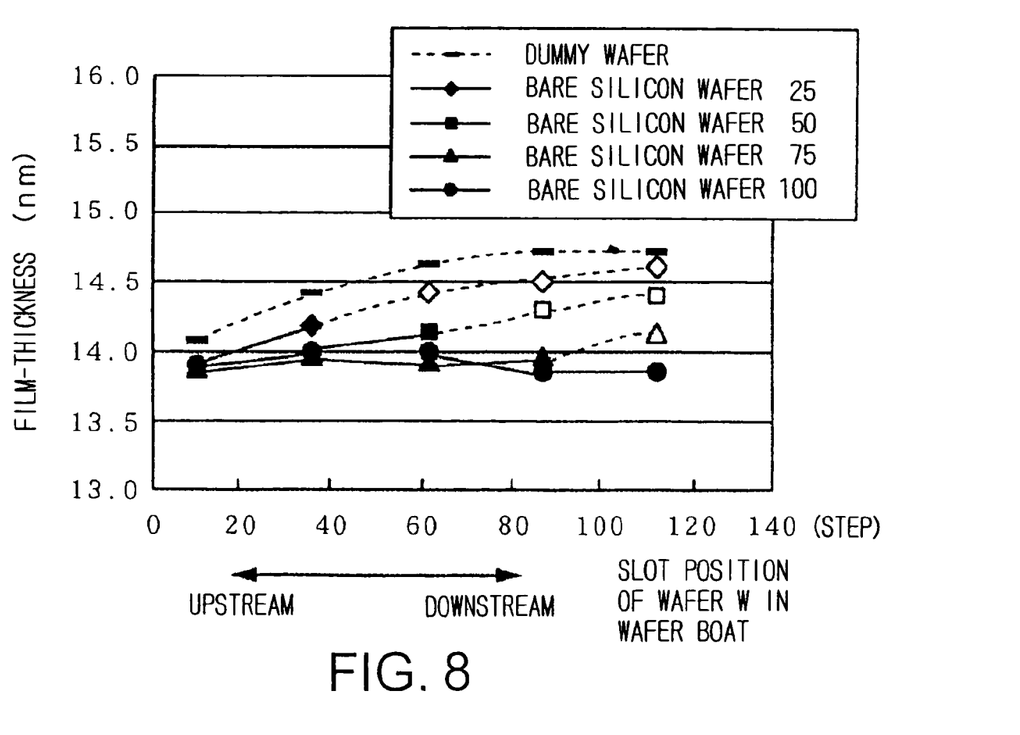
FIG. 8 is a characteristic chart showing a relationship between thermally-processed-wafer holding positions and film thicknesses, in the embodiment.

The measurement result of the film thickness is shown by FIG. 8. Data shown by white marks (○, Δ, □) are film thicknesses of the oxide films on the dummy wafers. In addition, film thicknesses when the dummy wafers were fully arranged in the wafer holding area and the thermal process was conducted are also shown in FIG. 8 by thick short line segments.

As seen from the results, although the film thickness is uneven in the area holding the dummy wafers, uniformity of the film thickness is high in the area holding the bare wafers. Thus, when wafers that may generate loading effect are thermally processed, if the temperature set values for the respective zones are adjusted in the same manner as the above embodiments, independently on the number of production wafers, high uniformity of film thickness between wafers can be achieved, nevertheless the common process conditions are used.

<Comparison>

Figure 9:
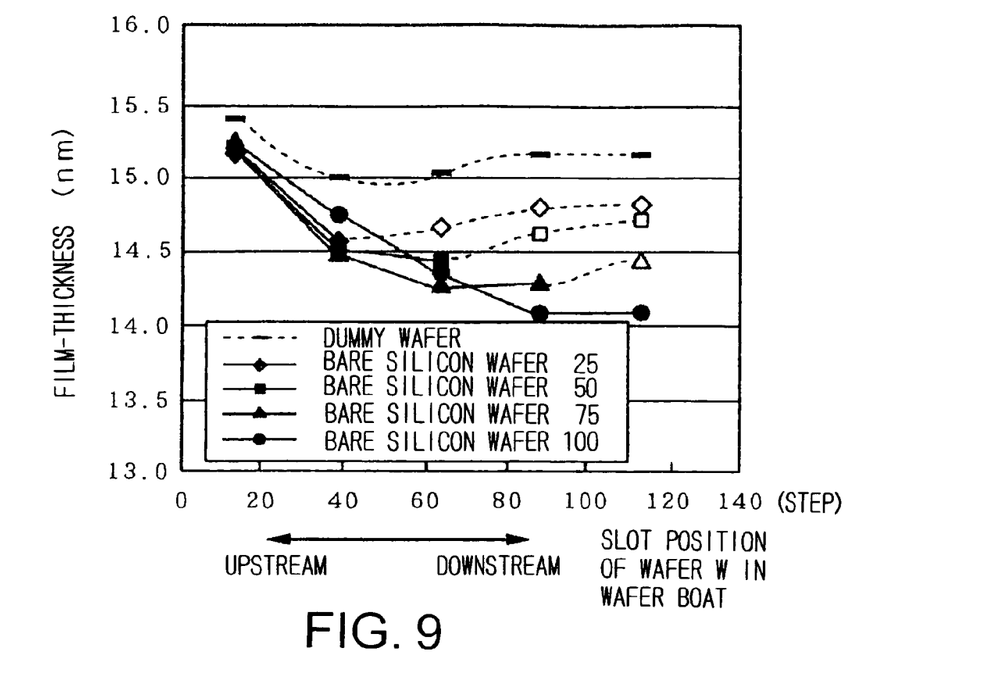
FIG. 9 is a characteristic chart showing a relationship between thermally-processed-wafer holding positions and film thicknesses, in a comparison.

Without an adjusting operation of the temperature set values by using bare wafers, only an adjusting operation by using dummy wafers was conducted. That is, the same experiment as the above example was conducted under a state wherein the result shown by ◇ in FIG. 7 was obtained. Then, the result shown in FIG. 9 was obtained. As seen from the result, the oxide films on the bare wafers suffer from the loading effect, so that the film thickness is thinner on a lower side as the number of bare wafers to be processed is larger.

The invention claimed is:

1. A thermal processing method including thermal processing steps having:
    a step of holding a plurality of substrates by means of a substrate holder,
    a step of conveying the substrate holder into a reaction container,
    a step of heating a plurality of zones of thermal process atmosphere in the reaction container by means of a plurality of heating units, respectively, and
    a step of forming thin films on surfaces of the plurality of substrates by introducing a process gas into the reaction container,
    the thermal processing method comprising:
    a first thermal processing step of carrying out the thermal processing steps by using a plurality of first substrates as the plurality of substrates, wherein thin films are formed on surfaces of the plurality of first substrates by less consumption of the process gas per film thickness than on surfaces of production substrates;
    a first measuring step of measuring a thickness of the thin films formed on the surfaces of the plurality of first substrates for each of the plurality of zones of the thermal process atmosphere in the reaction container;
    a first setting step of setting respective temperature set values of the plurality of heating units in such a manner that the thickness measured for each of the plurality of zones substantially coincides with a target thickness of thin films to be formed on the surfaces of production substrates, based on measurement result of the first measuring step;
    a second thermal processing step of carrying out the thermal processing steps by using a plurality of second substrates, different from the plurality of first substrates, as the plurality of substrates, wherein thin films are formed on surfaces of the plurality of second substrates by more consumption of the process gas per film thickness than on the surfaces of the plurality of first substrates, and wherein the plurality of heating units are respectively adjusted to the respective temperature set values set by the first setting step;
    a second measuring step of measuring a thickness of the thin films formed on the surfaces of the plurality of second substrates for each of the plurality of zones of the thermal process atmosphere in the reaction container;
    a second correcting step of correcting the respective temperature set values of the plurality of heating units in such a manner that the thickness measured for each of the plurality of zones substantially coincides with the target thickness of thin films to be formed on the surfaces of production substrates, based on measurement result of the second measuring step; and
    a third thermal processing step of carrying out the thermal processing steps by using at least a plurality of production substrates as the plurality of substrates, wherein the plurality of heating units are respectively adjusted to the respective temperature set values corrected by the second correcting step.

2. A thermal processing method according to claim 1, wherein
    the first setting step and the second correcting step are respectively carried out based on a relationship between variation of the temperature set values and variation of the thickness of the thin films, which has been obtained in advance.

3. A thermal processing method according to claim 1 or 2, wherein
    in the thermal processing steps, the process gas is activated to generate active species, and oxide films are formed on the surfaces of the substrates by means of the active species.

4. A thermal processing method according to claim 3, wherein
    the process gas comprises a hydrogen gas and an oxygen gas.

5. A thermal processing method according to claim 3, wherein
    the first substrates are substrates on which oxide films having an average thickness of 50 nm or more have been formed in advance.

6. A thermal processing method according to claim 3, wherein
    the second substrates are bare silicon substrates.

7. A thermal processing method according to claim 1 or 2, wherein
    in the thermal processing steps, the thin films are formed on the surfaces of the substrates by means of a chemical vapor deposition.

8. A thermal processing method according to claim 7, wherein
    the first substrates are substrates having surfaces on which patterns have not been formed, and
    the second substrates are substrates having surfaces on which patterns have been formed.

9. A thermal processing method according to claim 1 or 2, wherein
    in the first thermal processing step, the first substrates are fully arranged in a holding region for substrates to be processed in the substrate holder, and
    in the second thermal processing step, the second substrates are fully arranged in the holding region for substrates to be processed in the substrate holder.

10. A thermal processing method according to claim 9, wherein
    in the third thermal processing step, the production substrates are arranged at a portion on an upstream side of a flow of the process gas introduced into the reaction container, in the holding region for substrates to be processed in the substrate holder, and the first substrates are arranged at the residual portion in the holding region.

11. A thermal processing method according to claim 10, wherein
    a pressure in the reaction container, a flow rate of the process gas and a time of the thermal process are common in the second thermal processing step and in the third thermal processing step.

* * * * *